| (12) | United States Patent | (10) Patent No.: | US 8,624,218 B2 |
|---|---|---|---|
| | Chen | (45) Date of Patent: | Jan. 7, 2014 |

(54) NON-VOLATILE MEMORY STRUCTURE AND METHOD FOR FABRICATING THE SAME

(75) Inventor: Frederick T Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 8 days.

(21) Appl. No.: 13/342,171

(22) Filed: Jan. 2, 2012

(65) Prior Publication Data

US 2013/0168631 A1 Jul. 4, 2013

(51) Int. Cl.
*H01L 47/00* (2006.01)
*H01L 21/20* (2006.01)
*G11C 11/00* (2006.01)

(52) U.S. Cl.
USPC ............. 257/4; 257/E27.005; 257/E27.004; 365/148; 438/385

(58) Field of Classification Search
CPC ......... H01L 45/04; H01L 45/06; H01L 27/24; G11C 13/0002; G11C 13/0004; G11C 13/0009
USPC ............... 257/4, E27.005, E27.004; 365/147, 365/158, 171, 46, 100, 148; 438/382, 385, 438/238
See application file for complete search history.

(56) References Cited

U.S. PATENT DOCUMENTS

| 6,226,197 | B1 * | 5/2001 | Nishimura ................ 365/171 |
|---|---|---|---|
| 7,288,452 | B2 | 10/2007 | Lee |
| 2004/0174732 | A1 * | 9/2004 | Morimoto ................ 365/148 |
| 2005/0142801 | A1 | 6/2005 | Lee |
| 2006/0023503 | A1 | 2/2006 | Lee |
| 2008/0175041 | A1 * | 7/2008 | Aoki ......................... 365/158 |
| 2009/0190402 | A1 | 7/2009 | Hsu et al. |
| 2010/0258782 | A1 * | 10/2010 | Kuse et al. ................. 257/4 |
| 2011/0263093 | A1 * | 10/2011 | Joo et al. .................. 438/382 |

FOREIGN PATENT DOCUMENTS

| TW | 457714 | 10/2001 |
|---|---|---|
| TW | I282092 | 6/2007 |

OTHER PUBLICATIONS

Chiu et al, "A Low Store Energy, Low VDDmin, Nonvolatile 8T2R SRAM with 3D Stacked RRAM Devices for Low Power Mobile Applications," 2010 Symposium on VLSI Circuits/Technical Digest of Technical Papers, pp. 229-230, IEEE, 2010, USA.
Wang et al, "Nonvolatile SRAM Cell," Electron Devices Meeting, IEDM, 4 pages, 2006, USA.
Miwa et al, "NV-SRAM: A Nonvolatile SRAM with Backup Ferroelectric Capacitors," IEEE Journal of Solid-State Circuits, vol. 36, No. 3, pp. 522-527, Mar. 2001, USA.
Yamamoto et al, "Nonvolatile SRAM (NV-SRAM) Using Functional MOSFET Merged with Resistive Switching Devices," IEEE 2009 Custom Intergrated Circuits Conference (CICC), pp. 531-534, 2009, USA.

\* cited by examiner

*Primary Examiner* — Nikolay Yushin

(57) ABSTRACT

The disclosure provides a non-volatile memory structure and a method for fabricating the same. The non-volatile memory structure includes a first contact connected to a first transistor. A second contact is connected to a second transistor. A resistance-changing memory material pattern covers and contacts the second contact but not the first contact. A top electrode contacts both the resistance-changing memory material pattern and the first contact. An area of the resistance-changing memory material pattern is substantially larger than an area of its interface with the second contact.

24 Claims, 11 Drawing Sheets

NON-VOLATILE MEMORY STRUCTURE AND METHOD FOR FABRICATING THE SAME

BACKGROUND

1. Technical Field

The disclosure relates to a non-volatile memory structure and a method for fabricating the same, and in particular relates to a non-volatile static random access memory (SRAM) and a method for fabricating the same.

2. Related Art

Due to their high speeds and minimal power consumption, a static random access memory (SRAM) is an essential component of all logic, system-on-chip (SoC) and (multi-chip package) MCP components today. However, even as CMOS technology advances, transistor leakage is becoming a more significant issue, limiting the amount of power reduction from scaling. The use of a non-volatile memory component, such as a resistive random access memory (RRAM), a magnetic random access memory (MRAM), and a phase change memory (PCM), etc. would allow complete shutoff of the static random access memory (SRAM), leading to maximal reduction of leakage standby power in SRAM. Among the non-volatile memory technologies, resistive random access memory (RRAM or ReRAM) is a particularly promising non-volatile memory technology due to its low power consumption and high speed characteristics (e.g., H-Y Lee et al. IEDM 2008, 2010; P-F Chiu et al., VLSI Circuits 2010). Various designs for non-volatile SRAMs have been proposed, including a 6T2R, and 8T2R, etc., where T denotes a transistor and R denotes the resistance-based memory component within the SRAM cell. Often, the included memory components are connected between a transistor and a control line fabricated as a higher metal layer. This will lead to a high risk for plasma etching damage (particularly if the memory is made from oxides) from the antenna effect, as the control line will expose a much larger area to the process plasma than the memory component itself. As a result, for a successful non-volatile SRAM, it is necessary to devise a structure and corresponding manufacturing process to avoid damages thereto, as much as possible.

Thus, a novel non-volatile SRAM and a method for fabricating the same are desired.

SUMMARY

An embodiment of a non-volatile memory structure is provided. The non-volatile memory structure comprises a first contact connected to a first transistor. A second contact is connected to a second transistor. A resistance-changing memory material, which includes a material that may switch between higher and lower resistance states, covers and contacts the second contact but not the first contact. A top electrode contacts both the resistance-changing memory material and the first contact. The area of the resistance-changing memory material is substantially larger than the area of its interface with the second contact.

Another embodiment of a non-volatile memory structure comprises a first contact formed through a dielectric layer, connecting to a first transistor. A contact hole is formed through the dielectric layer. A resistance-changing memory material conformally covers the contact hole but not the first contact, connecting to a second transistor. A top electrode contacts both the resistance-changing memory material and the first contact. The area of the resistance-changing material is substantially larger than the area of a bottom of the contact hole covered by the resistance-changing material pattern.

An embodiment of a method for fabricating a non-volatile memory structure is provided. The method for fabricating the non-volatile memory structure comprises forming a first contact connected to a first transistor. A second contact is formed connected to a second transistor. A resistance-changing material is formed covering the first and second contacts. The resistance-changing material covering the first contact is removed. A top electrode is formed covering the resistance-changing material, and also covering the first contact.

Another embodiment of a method for fabricating a non-volatile memory structure comprises forming a dielectric layer covering a first transistor and a second transistor. A first and second contact holes are formed through the dielectric layer. A first contact is formed within the first contact hole to connect to a first transistor. A resistance-changing material is conformally formed covering a sidewall and a bottom of the second contact hole and the first contact, connecting to the second transistor. The resistance-changing material covering the first contact is removed. A top electrode is formed covering the resistance-changing material and the first contact, filling the second contact hole.

A detailed description is given in the following embodiments with reference to the accompanying drawings.

BRIEF DESCRIPTION OF THE DRAWINGS

The embodiment can be more fully understood by reading the subsequent detailed description and examples with references made to the accompanying drawings, wherein.

DETAILED DESCRIPTION OF THE DISCLOSURE

The following description is of the embodiment of carrying out the disclosure. This description is made for the purpose of illustrating the general principles of the embodiment and should not be taken in a limiting sense. The scope of the embodiment is determined by reference to the appended claims.

Figure 1:
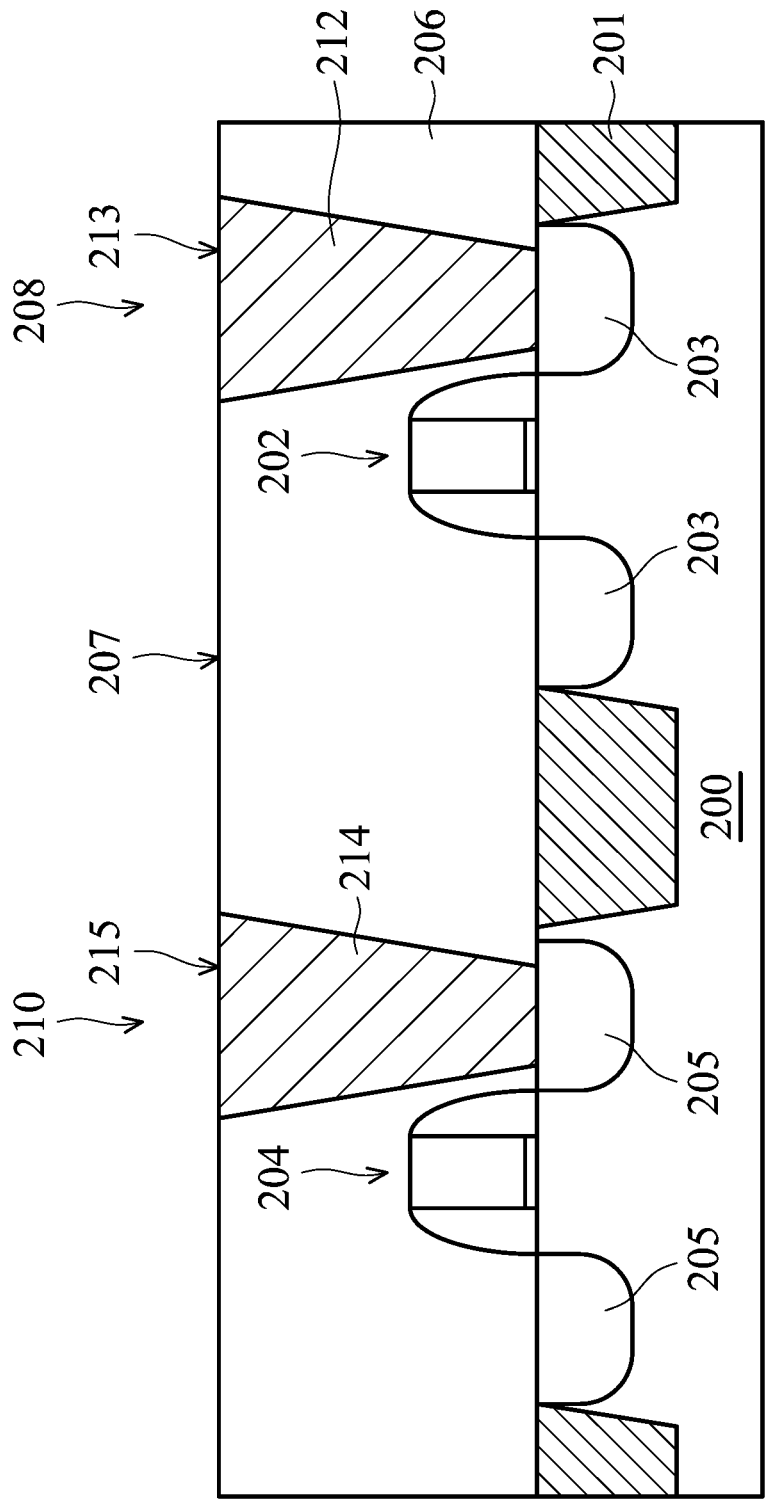
FIGS. 1-4 are cross sections showing the steps for fabricating a non-volatile memory structure according to an embodiment.

Embodiments provide a non-volatile memory structure and a method for fabricating the same. The non-volatile memory structure described herein is a RRAM device integrated with a non-volatile SRAM structure fabricated with processes that avoid the impact of plasma damage through the antenna effect. Furthermore, as the sidewalls are located remotely from the bottom contact to the RRAM oxide, the impact from sidewall damage from the etching process of a metal-insulator-metal (MIM) capacitor is mitigated. FIGS. 1-4 are cross sections showing the steps for fabricating a non-volatile memory structure 500a according to an embodiment. Initially, a substrate 200 is provided. In one embodiment, the substrate 200 may comprise silicon. In alternative embodiments, SiGe, bulk semiconductor, strained semiconductor, compound semiconductor, silicon on insulator (SOI), and other commonly used semiconductor substrates can be used for the substrate 200. The substrate 200 may have a desired conductive type by implanting P-type or N-type impurities. As shown in FIG. 1, several isolation structures 201, for example, shallow trench isolations (STIs), are formed extending from a surface of the substrate 200 into an interior of the substrate 200 as electrical isolations between various electronic devices. Next, a first transistor 202 and a second transistor 204 are respectively formed on the substrate 200. In one embodiment, the first transistor 202 and the second transistor 204 are transistors of a non-volatile SRAM cell. Next, a dielectric layer 206 is formed on the substrate 200, covering the first transistor 202 and the second transistor 204 by a deposition method, for example, a spin-coating method, a chemical vapor deposition (CVD) method, a physical vapor deposition (PVD) method or a plating method. Next, a photolithography process and an anisotropic etching process are performed to move a portion of the dielectric layer 206, so that first and second contact holes 208 and 210 are formed through the dielectric layer 206. As shown in FIG. 1, a source/drain region 203 of the first transistor 202 is exposed from a bottom of the first contact hole 208, and a source/drain region 205 of the second transistor 204 is exposed from a bottom of the second contact hole 210.

Next, a conductive material (not shown), such as tungsten (W), aluminum (Al), copper (Cu) or silicides, is filled into the first and second contact holes 208 and 210 using a PVD process. Next, a planarization process, for example, a chemical mechanical polishing (CMP) process is performed on the conductive material to remove unnecessary portions of the conductive material above the top surface 207 of the dielectric layer 206, so that first and second contacts 212 and 214 are formed through the dielectric layer 206. As shown in FIG. 1, the first contact 212 is connected to the first transistor 202, and the second contact 214 is connected to the second transistor 204. Due to the planarization process, a top surface 213 of the first contact 212 and top surface 215 of the second contact 214 are both aligned to the top surface 207 of the dielectric layer 206.

Figure 2:
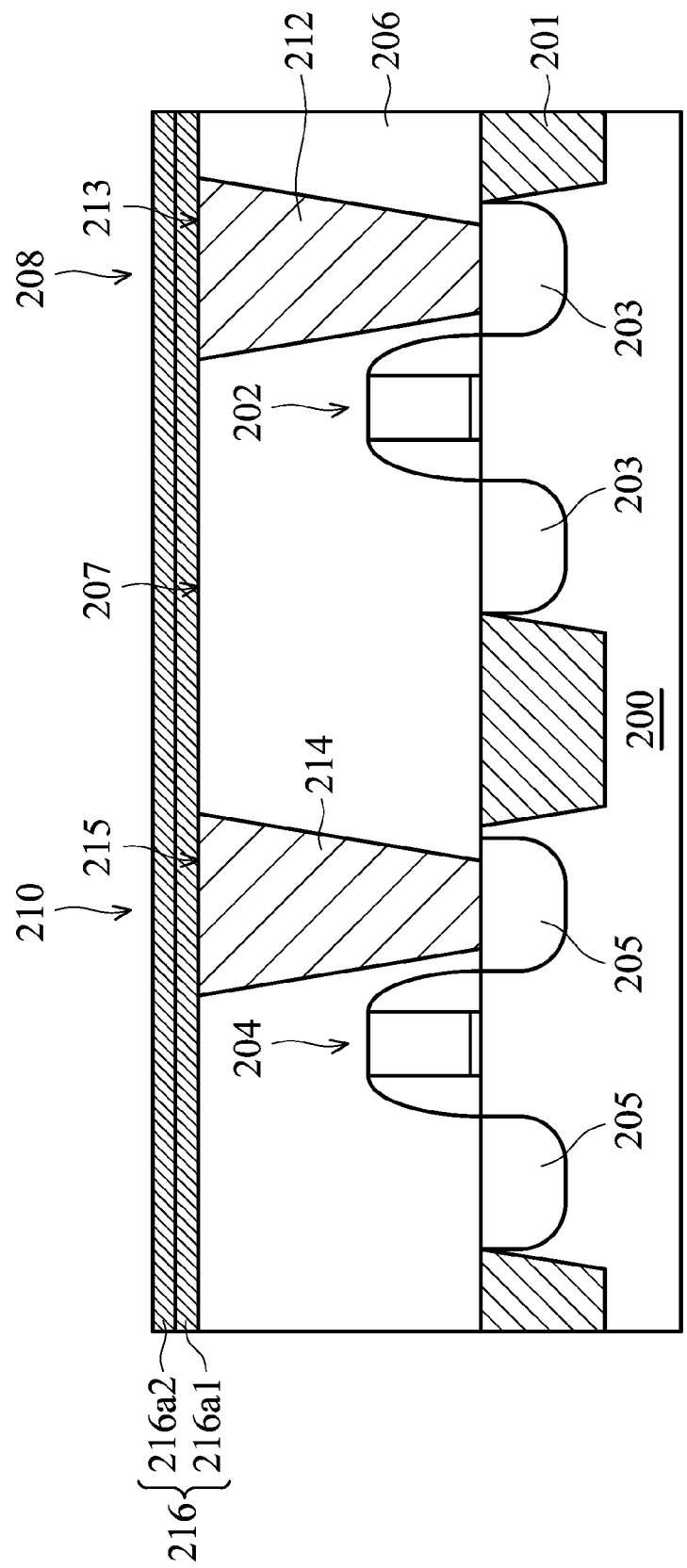

As shown in FIG. 2, a resistance-changing memory material 216 is then deposited by a deposition method, for example, an atomic layer deposition (ALD) method, covering both the first and second contacts 212 and 214. In one embodiment, the resistance-changing memory material 216 may comprise a RRAM oxide such as $HfO_2$. In one embodiment, the resistance-changing memory material 216 may be formed by a single layer. In another embodiment, the resistance-changing memory material 216 may be formed by depositing additional layers, including serial resistance layers, whose resistance may be fixed or dynamically controlled by the voltage across it. For example, the resistance-changing memory material 216 may comprise a first memory material layer 216a1 (e.g., $HfO_2$) that can switch between a state of higher electrical resistance and a state of lower electrical resistance, and a second memory material layer 216a2 above the first memory material layer 216a1 whose electrical resistance can be dynamically controlled by the voltage across it (e.g., $TiO_2$ or $VO_2$). Alternatively, the resistance-changing memory material 216 may comprise a first memory material layer 216a1 that can switch between a state of higher electrical resistance and a state of lower electrical resistance (e.g., TaOx), and a second memory material layer 216a2 above or below the first memory material layer whose electrical resistance is fixed (e.g., TaO).

Figure 3:
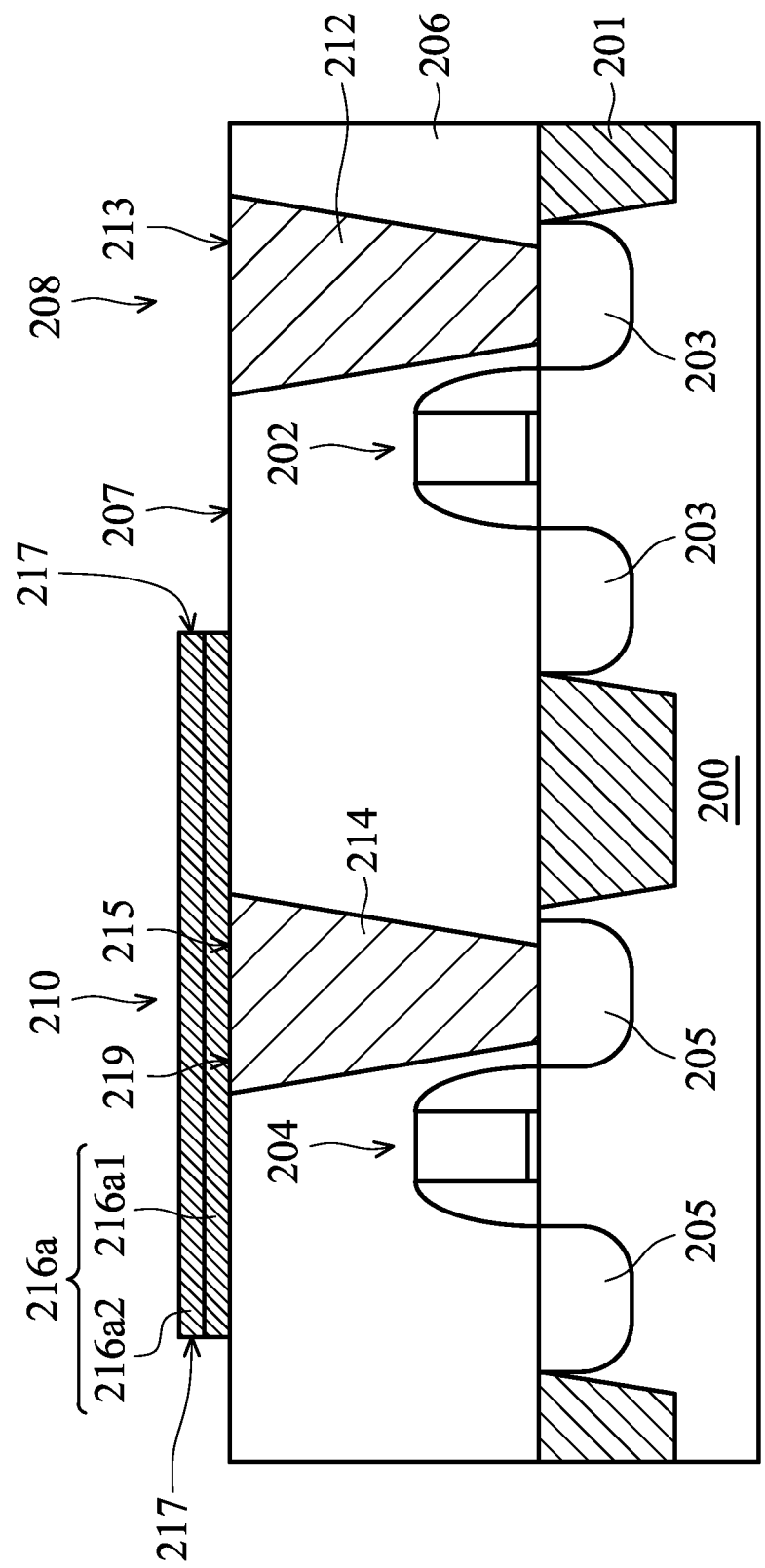

As shown in FIG. 3, a portion of the resistance-changing memory material 216 covering the contact to one of the transistors, for example, the first contact 212 to the first transistor 202, is then removed by an etching process such as a plasma etching process, so that a resistance-changing memory material pattern 216a is formed covering and contacting the second contact 214 but not the first contact 212. In one embodiment, the second contact 214 may serve as a bottom electrode of a final RRAM device. During the etching process of the resistance-changing memory material, no damage occurs on an interface between the second contact 214 and the resistance-changing memory material pattern 216a, which also serves as an active area of the final RRAM device. This is because, as the resistance-changing memory material 216 over the first contact 212 is thinned during the etching process, more plasma current tends to leak to the first contact 212, which also presents a low-resistance path to the substrate 200 (i.e., the first transistor 202). Also, boundaries/sidewalls 217 of the resistance-changing memory material 216 are far away from the interface between the second contact 214 and the resistance-changing memory material pattern 216a. Therefore, the area of the resistance-changing memory material 216a is substantially larger than the area of its interface with the second contact 214. In this embodiment, the resistance-changing memory material pattern 216a has a planar bottom surface 219.

Figure 4:
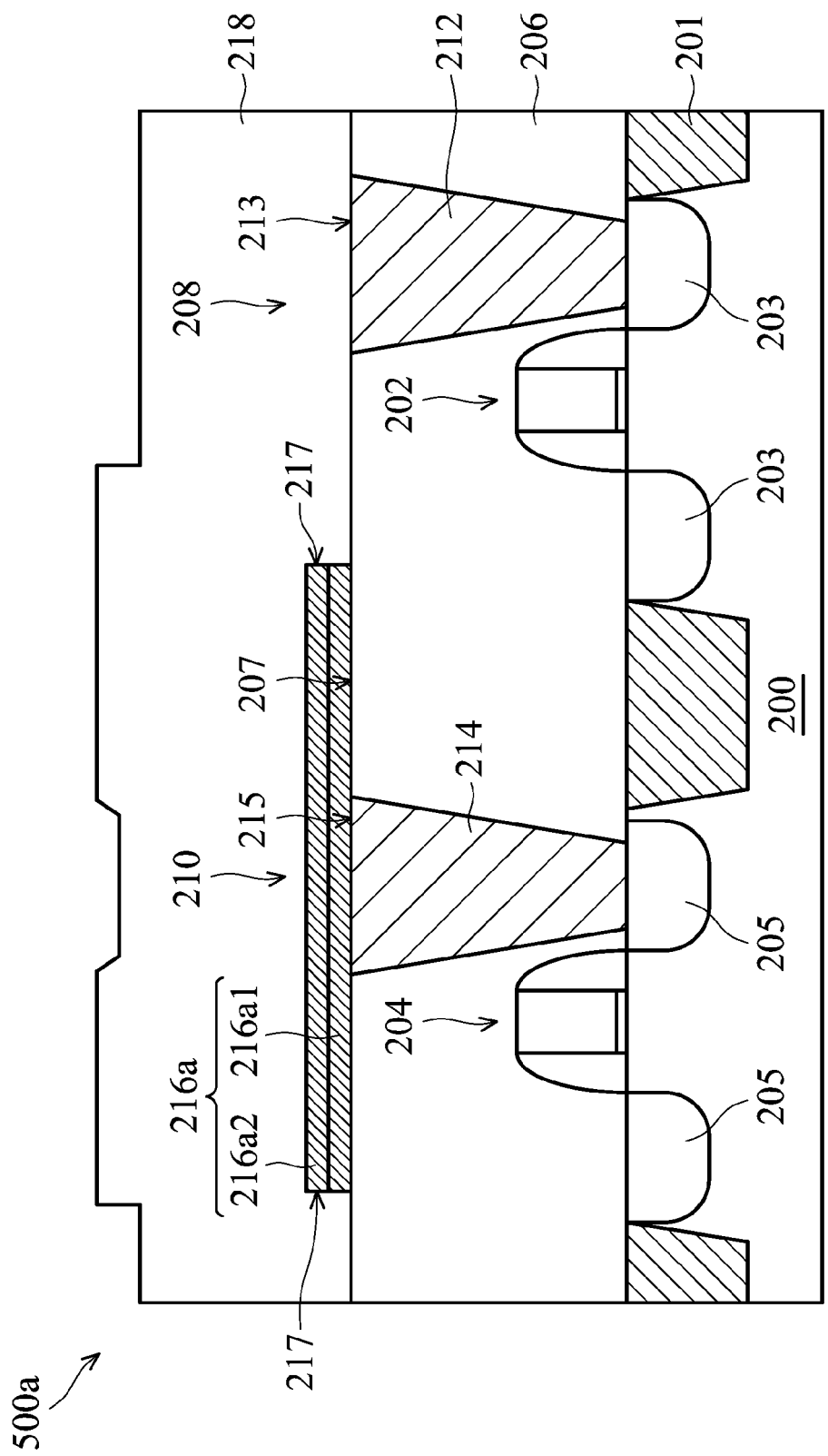

As shown in FIG. 4, next, a conductive material (e.g., Ti followed by TiN) (not shown) is entirely formed over the resistance-changing memory material pattern 216a, also covering the exposed first contact 212. The conductive metal may be formed by a deposition method, for example, a physical vapor deposition (PVD) method, an atomic layer deposition (ALD) method or a plating method. The conductive metal is then etched by an etching process, for example, a plasma etching process, to form a top electrode 218 of a final RRAM device contacting both the resistance-changing memory material pattern 216a and the first contact 212, wherein the top electrode 218 covers a top surface and a sidewall 217 of the resistance-changing memory material pattern 216a, thereby completing formation of one exemplary embodiment of a non-volatile memory structure 500a of the disclosure. During the etching process for the conductive metal, all the plasma current will go through the first contact 212 not connected to the resistance-changing memory material pattern 216a, since it is a much lower resistance path to the substrate 200. Meanwhile, sidewall damage of the etching process for the conductive metal is located even further away from the interface between the second contact 214 and the resistance-changing memory material pattern 216a than the previous etching process for the resistance-changing memory material pattern 216a.

Figure 5:
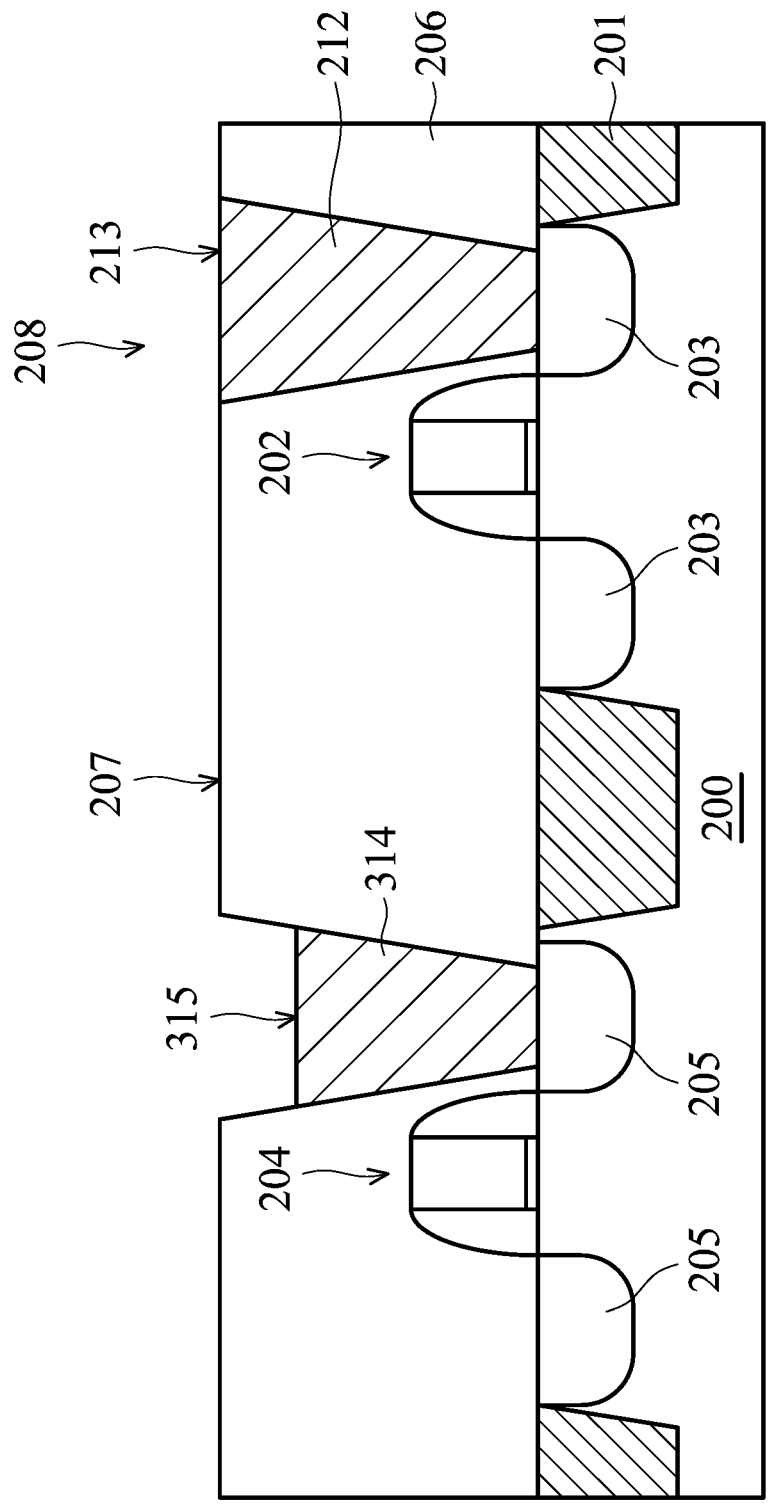
FIGS. 5-6 are cross sections showing the steps for fabricating a non-volatile memory structure according to another embodiment.
Figure 6:
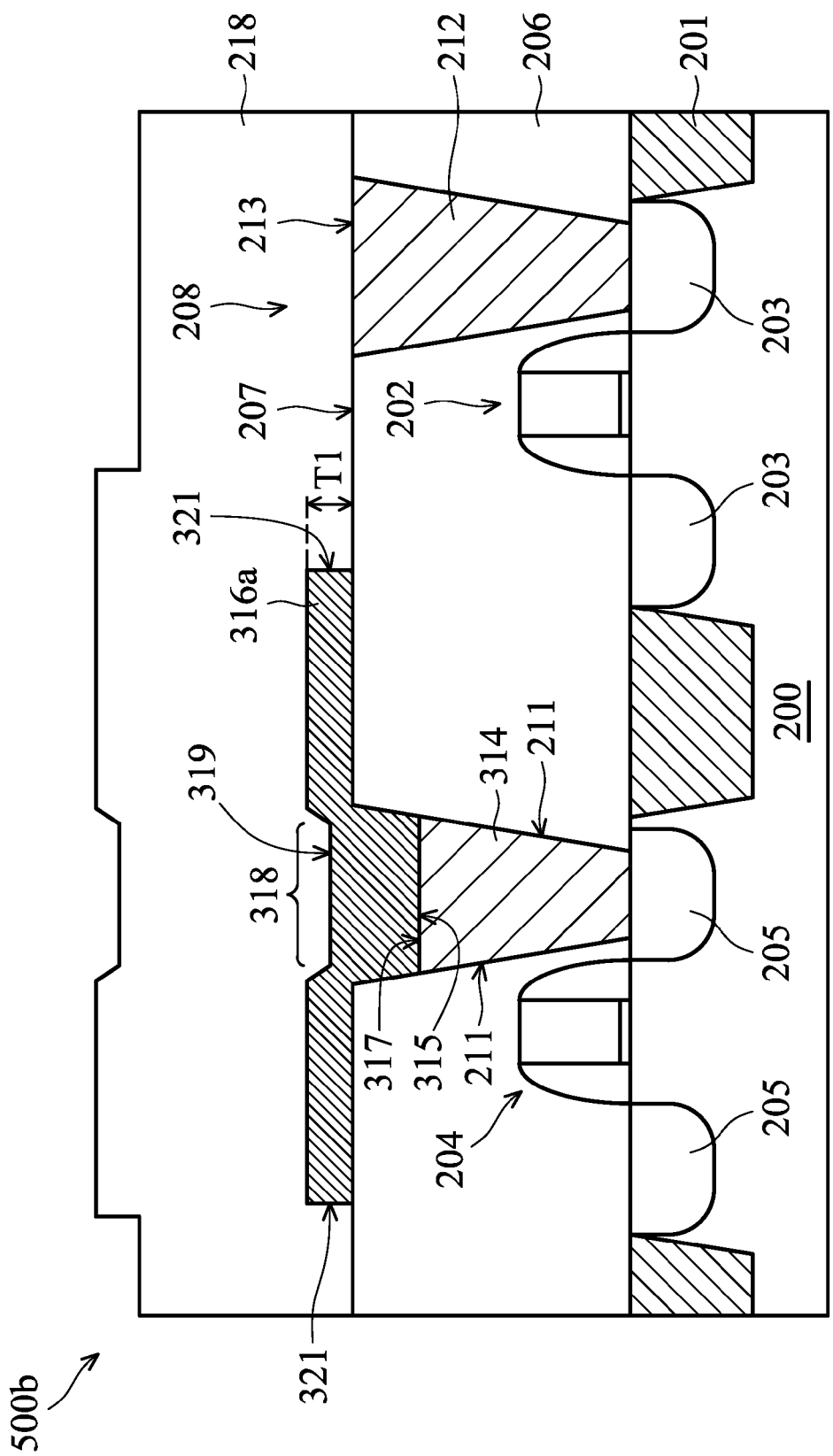

Alternative embodiments may be applied for the purpose of further reducing the interface area (active area) between the second contact and the resistance-changing memory material pattern. This could result in lower current and less variability in the performance. FIGS. 5-6 are cross sections showing the steps for fabricating a non-volatile memory structure 500b according to another embodiment. Elements of the embodiments hereinafter, that are the same or similar as those previously described with reference to FIGS. 1-4, are not repeated for brevity.

As shown in FIG. 5, after forming the first contact 212 and the second contact 214 as shown in FIG. 1, an etching back process is performed to remove a portion of the second contact 214 to form a second contact 314, so that a top surface 315 of the second contact 314 is lower than the top surface 213 of the first contact 212.

As shown in FIG. 6, next, a resistance-changing memory material is then deposited by a deposition method, for example, an atomic layer deposition (ALD) method, covering both the first and second contacts 212 and 314. In this embodiment, the composition of the resistance-changing memory material can be similar to the resistance-changing memory material 216 as shown in FIG. 2. A portion of the resistance-changing memory material covering the contact to one of the transistors, for example, the first contact 212 to the first transistor 202, is then removed by an etching process such as a plasma etching process, so that a resistance-changing memory material pattern 316a is formed covering and contacting the second contact 314 but not the first contact 212. The resistance-changing memory material pattern 316a has a recessed portion 318 covering a portion of the sidewall 211 of the second contact hole 210, and a bottom surface 317 of the recessed portion 318 connects to the top surface 315 of the second contact 314. As shown in FIG. 6, in this embodiment, the resistance-changing memory material pattern 316a has a thickness of T1, and a top surface 319 of the recessed portion 318 is still higher than the top surface 207 of the dielectric layer 206. In this embodiment, an interface between the second contact 314 and the resistance-changing memory material pattern 316a has reduced area due to the second contact 314 being recessed from a top of the taper second contact hole 210. Also, the area of the resistance-changing memory material pattern 316a is substantially larger than the area of its interface with the second contact 314.

Still referring to FIG. 6, next, a conductive material (e.g., Ti followed by TiN) (not shown) is entirely formed over the resistance-changing memory material pattern 316a, also covering the exposed first contact 212. The conductive material may be formed by a deposition method, for example, a physical vapor deposition (PVD) method, an atomic layer deposition (ALD) method or a plating method. The conductive material is then etched by an etching process, for example, a plasma etching process, to form a top electrode 218 of a final RRAM device contacting both the resistance-changing memory material pattern 316a and the first contact 212, wherein the top electrode 218 covers a top surface and a sidewall 321 of the resistance-changing memory material pattern 316a, thereby completing formation of another exemplary embodiment of a non-volatile memory structure 500b of the disclosure. Differences between the non-volatile memory structures 500a and 500b is that the non-volatile memory structure 500b has a reduced active area.

Figure 7:
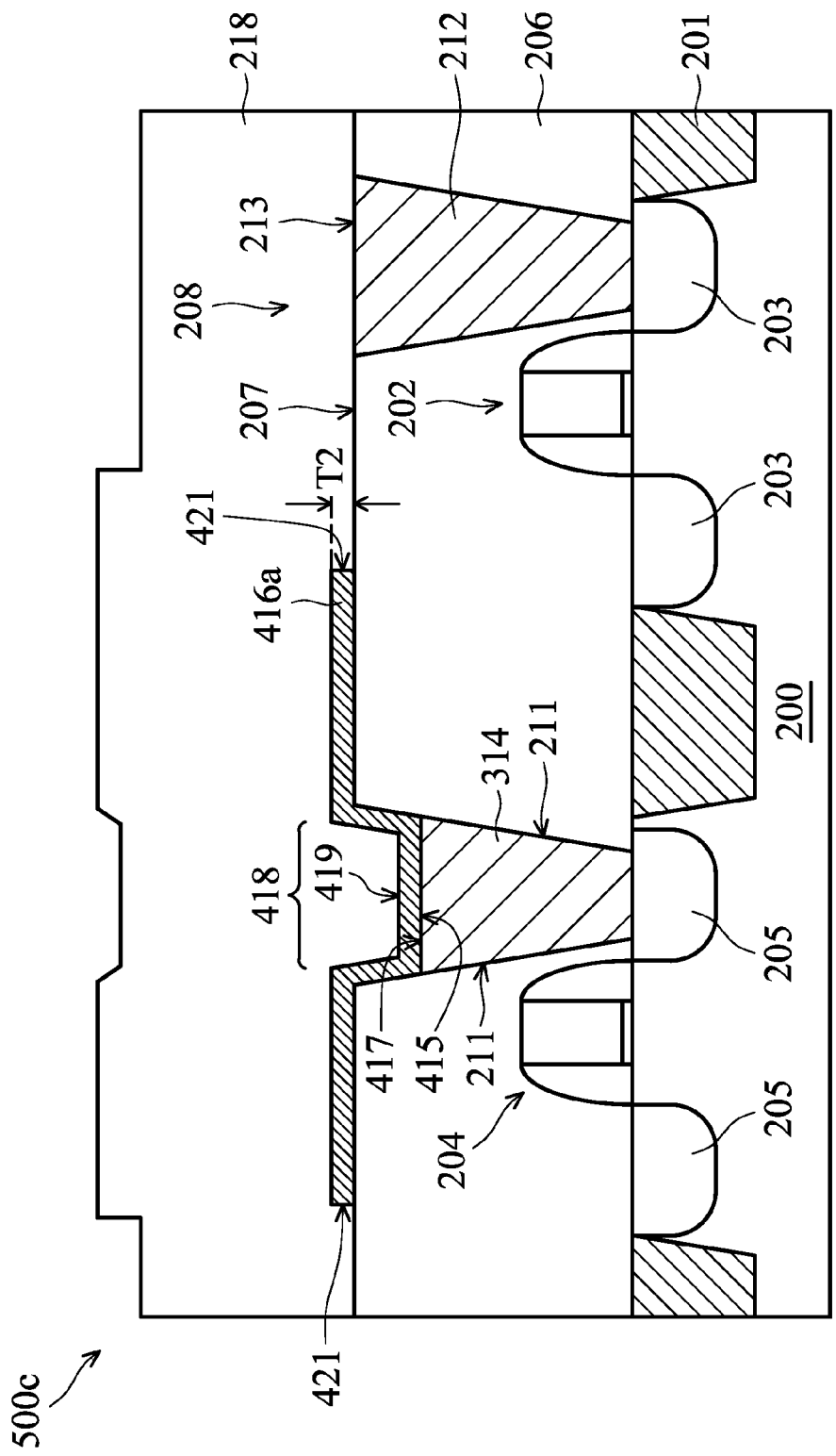
FIG. 7 is cross section showing the step for fabricating a non-volatile memory structure according to yet another embodiment.

FIG. 7 is cross section showing the step for fabricating a non-volatile memory structure 500c according to yet another embodiment. Elements of the embodiments hereinafter, that are the same or similar as those previously described with reference to FIGS. 1-6, are not repeated for brevity. As shown in FIG. 7, after the first contact 212 and the second contact 314 are formed as shown in FIG. 5, a resistance-changing memory material which is thin enough is then conformally formed by a deposition method, for example, an atomic layer deposition (ALD) method, covering both the first and second contacts 212 and 314. In this embodiment, the composition of the resistance-changing memory material can be similar to the resistance-changing memory material 216 as shown in FIG. 2. A portion of the resistance-changing memory material covering the contact to one of the transistors, for example, the first contact 212 to the first transistor 202, is then removed by an etching process such as a plasma etching process, so that a resistance-changing memory material pattern 416a is formed covering and contacting the second contact 314 but not the first contact 212. The resistance-changing memory material pattern 416a has a recessed portion 418 covering a portion of the sidewall 211 of the second contact hole 210, and a bottom surface 417 of the recessed portion 418 connects to the top surface 415 of the second contact 314. As shown in FIG. 7, in this embodiment, the resistance-changing memory material pattern 416a has a thickness T2 that is thinner that the thickness T1 of the resistance-changing memory material pattern 316a as shown in FIG. 6, and a top surface 419 of the recess portion 418 is lower than the top surface 207 of the dielectric layer 206. In this embodiment, an interface between the second contact 314 and the resistance-changing memory material pattern 416a has a reduced area due to the second contact 314 being recessed from a top of the taper second contact hole 210. Also, the area of the resistance-changing memory material pattern 416a is substantially larger than the area of its interface with the second contact 314.

Still referring to FIG. 7, next, a conductive material (e.g., Ti followed by TiN) (not shown) is entirely formed over the resistance-changing memory material pattern 416a, also covering the exposed first contact 212. The conductive material may be formed by a deposition method, for example, a physical vapor deposition (PVD) method, an atomic layer deposition (ALD) method or a plating method. The conductive material is then etched by an etching process, for example, a plasma etching process, to form a top electrode 218 of a final RRAM device contacting both the resistance-changing memory material pattern 416a and the first contact 212, wherein the top electrode 218 covers a top surface and a sidewall 421 of the resistance-changing memory material pattern 416a, thereby completing formation of still another exemplary embodiment of a non-volatile memory structure 500c of the disclosure. Differences between the non-volatile memory structures 500c and 500b is that the non-volatile memory structure 500c has a reduced active area due to the recessed portion 418 of the resistance-changing memory material pattern 416a which is thin enough, so that the top electrode 218 partly enters the contact hole region.

Figure 8:
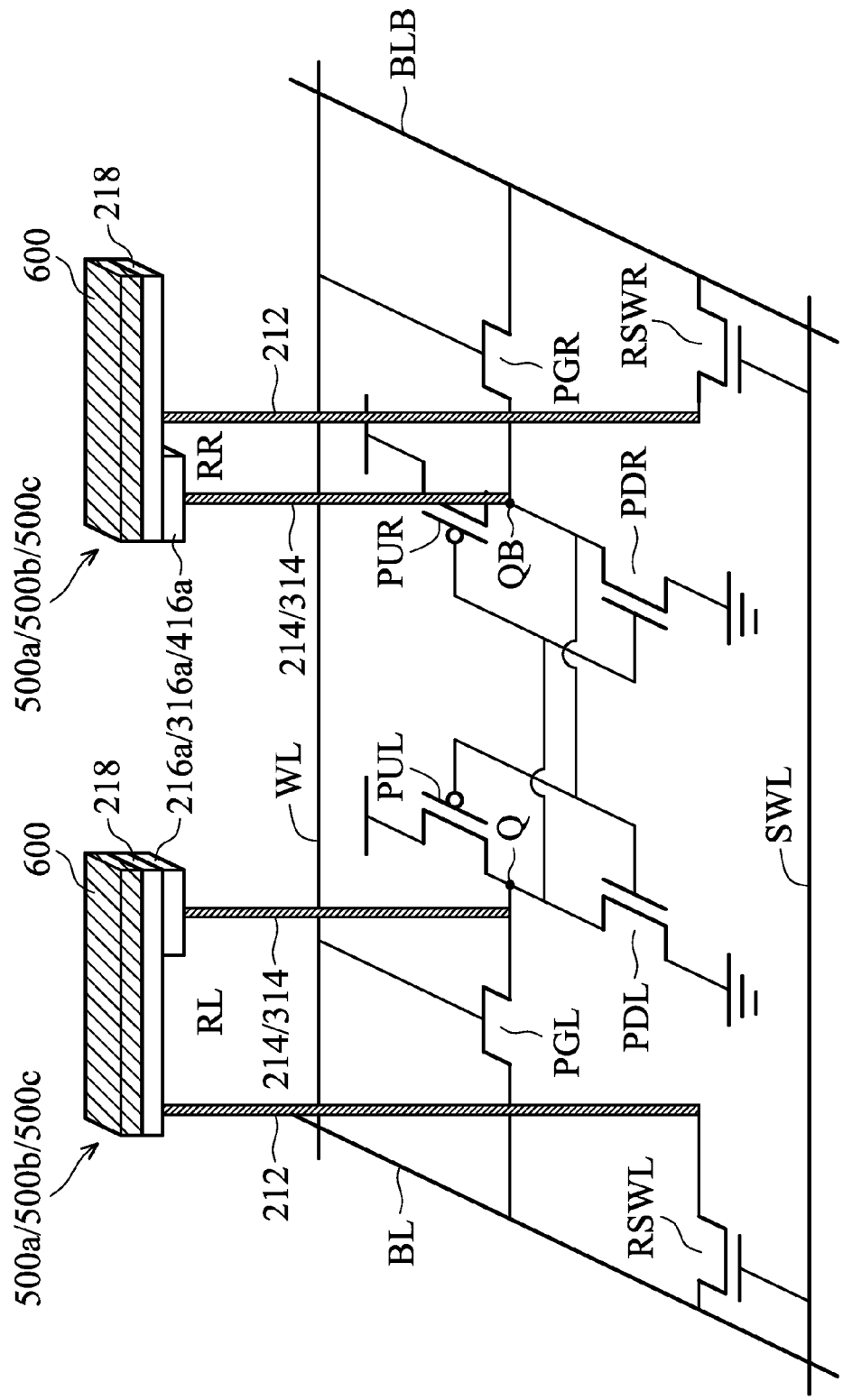
FIG. 8 is a circuit and layout showing one embodiment of a non-volatile 8T SRAM.

FIG. 8 is a circuit and layout showing one embodiment of a non-volatile 8T SRAM, which comprises a 6T SRAM, 2T RRAM-switch (RSW) and two non-volatile memory structures 500a/500b/500c, which are used as RRAM devices (also labeled as RR and RL). As shown in FIG. 8, a metal line 600 is disposed covering the top electrode 218 of the non-volatile memory structure 500a/500b/500c. The top electrode 218 extends covering from the resistance-changing memory material pattern 216a/316a/416a on the second contact 214/314 to the first contact 212. Therefore, the non-volatile 8T SRAM comprising the RRAM devices (RR and RL)) formed by the non-volatile memory structures 500a/500b/500c do not need a via connected between the RRAM devices and the top electrode 218.

Figure 9:
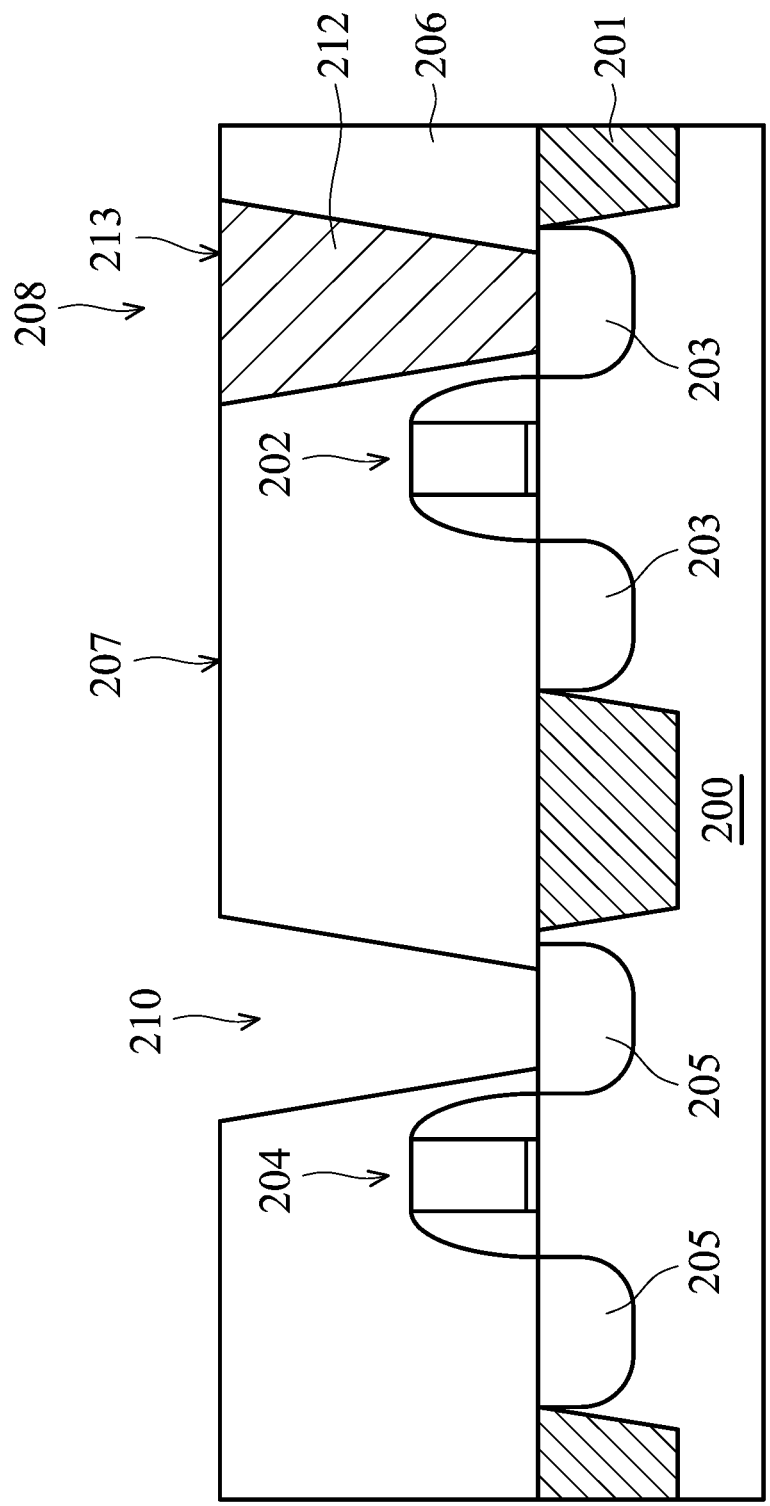
FIGS. 9-10 are cross sections showing the steps for fabricating a non-volatile memory structure according to still yet another embodiment.
Figure 10:
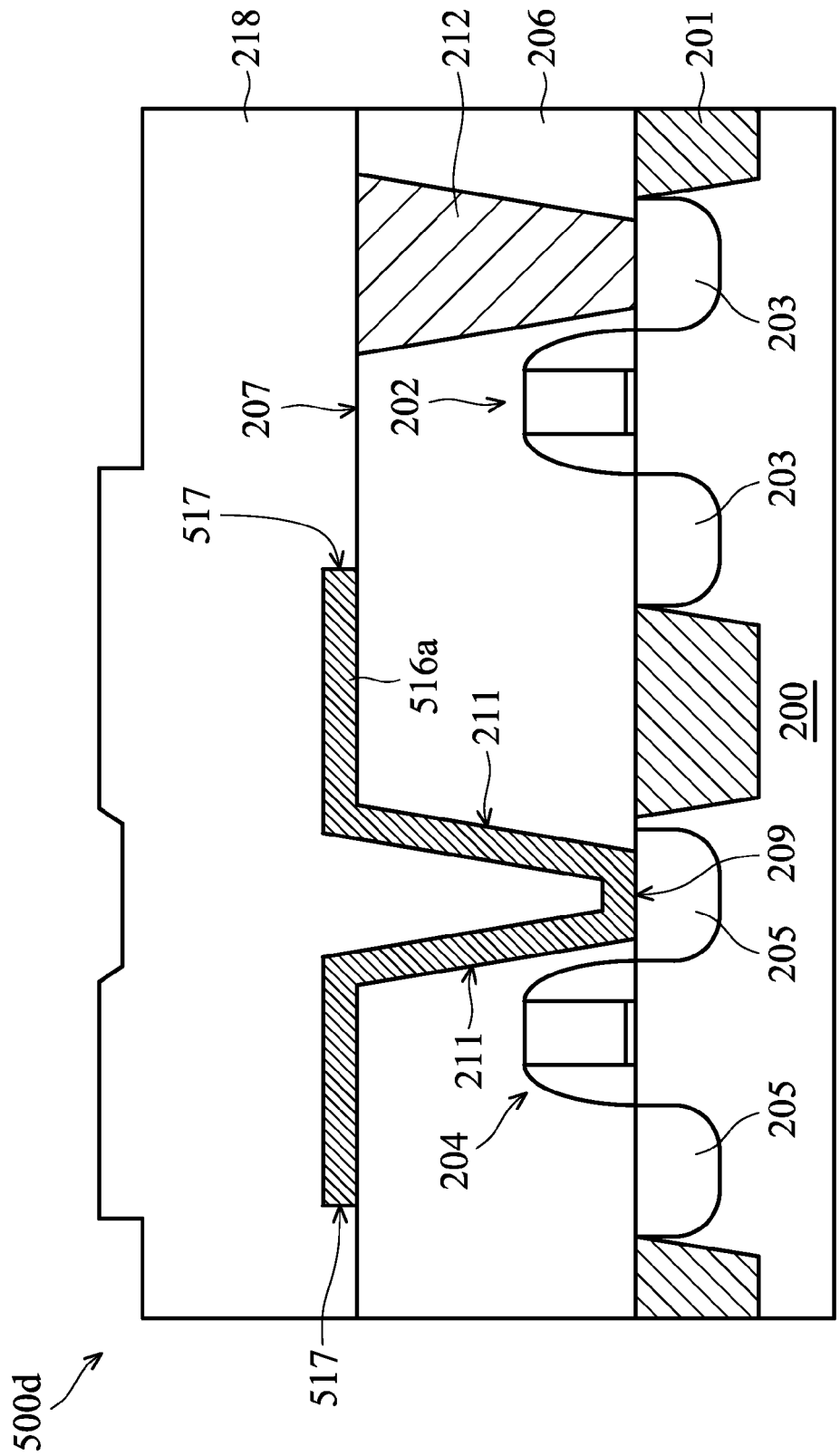

FIGS. 9-10 are cross sections showing the steps for fabricating a non-volatile memory structure 500d according to still yet another embodiment. Elements of the embodiments hereinafter, that are the same or similar as those previously described with reference to FIGS. 1-7, are not repeated for brevity. As shown in FIG. 9, after forming the first contact 212 and the second contact 214 as shown in FIG. 1, an etching back process is performed to fully remove the second contact 214 as shown in FIG. 1, exposing the second contact hole 210. In this embodiment, an additional conductive layer (not shown) such as a silicide may be disposed at the bottom of the second contact hole 210 for an electrical connection between the subsequent resistance-changing memory material pattern and the second transistor 204.

As shown in FIG. 10, a resistance-changing memory material which is thin enough is then conformally formed by a deposition method, for example, an atomic layer deposition (ALD) method, covering the first contact 212 and the entire sidewall 211 and a bottom 209 of the second contact hole 210. In this embodiment, the composition of the resistance-changing memory material can be similar to the resistance-changing memory material 216 as shown in FIG. 2. A portion of the resistance-changing memory material covering the contact to one of the transistors, for example, the first contact 212 to the first transistor 202, is then removed by an etching process such as a plasma etching process, so that a resistance-changing memory material pattern 516a is formed conformally covering the second contact hole 210 but not the first contact 212. In this embodiment, the resistance-changing memory material pattern 516a extends over the top surface 207 of the dielectric layer 206. Therefore, the resistance-changing memory material pattern 516a connects to the second transistor 204 directly or through a conductive layer (not shown). In this embodiment, an interface between the conductive layer and the resistance-changing memory material pattern 516a on the bottom of the second contact hole 210 has a much reduced area because the resistance-changing memory material pattern 516a conformally fills the entire second contact hole 210. Also, the area of the resistance-changing memory material pattern 516a is substantially larger than an area of its interface with the conductive layer or the bottom 209 of the second contact hole 210 covered by the resistance-changing material pattern 516a.

Still referring to FIG. 10, next, a conductive material (e.g., Ti followed by TiN) (not shown) is entirely formed over the resistance-changing memory material pattern 516a, also covering the exposed first contact 212. In this embodiment, the conductive material also fills the second contact hole 210. The conductive material may be formed by a deposition method, for example, a physical vapor deposition (PVD) method, an atomic layer deposition (ALD) method or a plating method. The conductive metal is then etched by an etching process, for example, a plasma etching process, to form a top electrode 218 of a final RRAM device contacting both the resistance-changing memory material pattern 516a and the first contact 212, wherein the top electrode 218 covers a top surface and a sidewall 517 of the resistance-changing memory material pattern 516a, thereby completing formation of still yet exemplary embodiment of a non-volatile memory structure 500d of the disclosure. Differences between the non-volatile memory structures 500d and 500c is that the non-volatile memory structure 500d has a much reduced active area because the resistance-changing memory material pattern 516a conformally fills the entire second contact hole 210.

Figure 11:
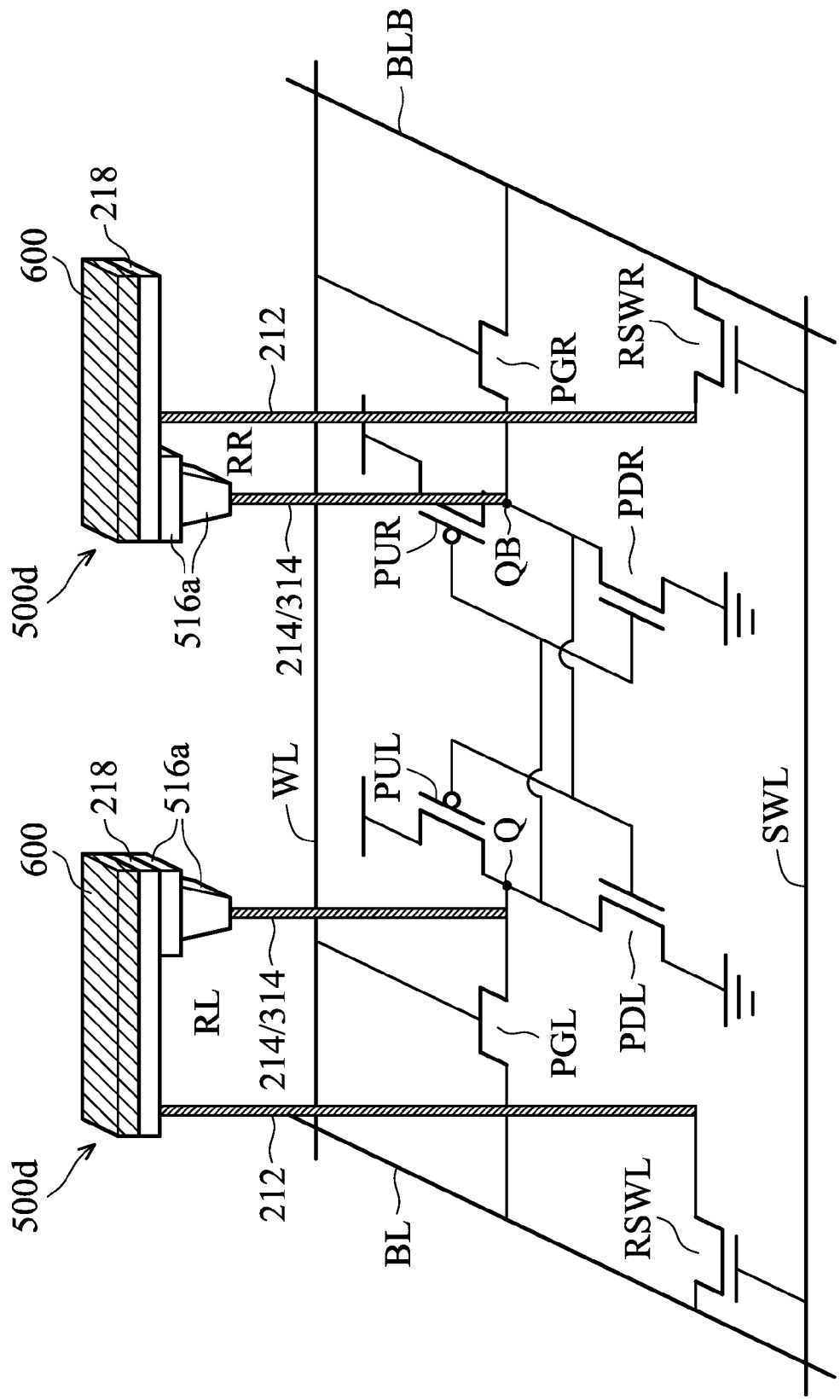
FIG. 11 is a circuit and layout showing another embodiment of a non-volatile 8T SRAM.

FIG. 11 is a circuit and layout showing another embodiment of a non-volatile 8T SRAM, which comprises a 6T SRAM, 2T RRAM-switch (RSW) and two non-volatile memory structures 500d, which are used as RRAM devices (also labeled as RR and RL). As shown in FIG. 11, a metal line 600 is disposed covering the top electrode 218 of the non-volatile memory structure 500d. The top electrode 218 extends covering from the resistance-changing memory material pattern 516a to the first contact 212. Therefore, the non-volatile 8T SRAM comprising the RRAM devices formed by the non-volatile memory structures 500d do not need vias connected between the RRAM devices (RR and RL) and the top electrode 218.

Embodiments provide various non-volatile memory structures 500a-500d and methods for fabricating the same. During the etching process of the resistance-changing memory material, no damage occurs to the interface between the resistance-changing memory material pattern and the contact connecting thereof, which also serves as an active area of the final RRAM device. Because the resistance-changing memory material over the contact not located at the active area is thinned during the etching process, more plasma current tends to leak to the contact not located at the active area, which also presents a low-resistance path to the substrate. Also, boundaries of the resistance-changing memory material are located far enough away from the active area. During the etching process for the top electrode, all the plasma current will go through the contact not connected to the resistance-changing memory material pattern, since it is a much lower resistance path to the substrate. Also, sidewall damage during the etching process for the top electrode is located even further away from the active area. Alternatively, a contact that is not located at the active area is fabricated first, and next the opening for the active area contact is subsequently formed and filled by metal to be etched back or filled by RRAM oxide directly.

The disclosure mitigates process damage from etching for both the well-known antenna effect and the sidewall damage aspects of fabrication, which directly affects device performance. Consequently, a successful construction of a high-performance nonvolatile SRAM, e.g. the 8T2R structure of Chiu et al, is accomplished.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory structure, comprising:
a first contact connected to a first transistor;
a second contact connected to a second transistor;
a resistance-changing memory material covering and directly contacting the second contact but not the first contact; and
a top electrode contacting both the resistance-changing memory material and the first contact,
wherein an area of the resistance-changing memory material is substantially larger than an area of its interface with the second contact.

2. The non-volatile memory structure as claimed in claim 1, wherein the first contact and the second contact are formed through a dielectric layer on the first and second transistors.

3. The non-volatile memory structure as claimed in claim 2, wherein a top surface of the first contact is aligned to that of the second contact.

4. The non-volatile memory structure as claimed in claim 3, wherein the resistance-changing memory material has a planar bottom surface.

5. The non-volatile memory structure as claimed in claim 2, wherein a top surface of the second contact is lower than that of the first contact.

6. The non-volatile memory structure as claimed in claim 5, wherein the resistance-changing memory material has a recessed portion, and a bottom surface of the recessed portion connects to the top surface of the second contact.

7. The non-volatile memory structure as claimed in claim 6, wherein a top surface of the recessed portion is higher than that of the dielectric layer.

8. The non-volatile memory structure as claimed in claim 6, wherein a top surface of the recessed portion is lower than that of the dielectric layer.

9. The non-volatile memory structure as claimed in claim 1, wherein the top electrode covers a top surface and a sidewall of the resistance-changing memory material.

10. The non-volatile memory structure as claimed in claim 1, wherein the resistance-changing memory material comprises a first memory material layer that can switch between a state of higher electrical resistance and a state of lower electrical resistance, and a second memory material layer whose electrical resistance can be dynamically controlled by the voltage across it.

11. The non-volatile memory structure as claimed in claim 1, wherein the resistance-changing memory material includes a first memory material layer that can switch between a state of higher electrical resistance and a state of lower electrical resistance, and a second memory material layer whose electrical resistance is fixed.

12. A non-volatile memory structure, comprising:
a first contact formed through a dielectric layer, connecting to a first transistor;
a contact hole formed through the dielectric layer;
a resistance-changing memory material conformally covering and directly contacting the contact hole but not the first contact, connecting to a second transistor; and
a top electrode contacting both the resistance-changing memory material and the first contact,
wherein an area of the resistance-changing material is substantially larger than an area of a bottom of the contact hole covered by the resistance-changing material.

13. The non-volatile memory structure as claimed in claim 12, wherein the top electrode fills the contact hole.

14. The non-volatile memory structure as claimed in claim 12, wherein the top electrode covers a top surface and a sidewall of the resistance-changing memory material.

15. The non-volatile memory structure as claimed in claim 12, further comprising a conductive layer disposed under the contact hole for an electrical connection between the resistance-changing memory material and the second transistor.

16. The non-volatile memory structure as claimed in claim 12, wherein the resistance-changing memory material extends over a top surface of the dielectric layer.

17. The non-volatile memory structure as claimed in claim 12, wherein the dielectric layer is disposed on the first and second transistors.

18. The non-volatile memory structure as claimed in claim 12, wherein the resistance-changing memory material comprises a first memory material layer that can switch between a state of higher electrical resistance and a state of lower electrical resistance, and a second memory material layer whose electrical resistance can be dynamically controlled by the voltage across it.

19. The non-volatile memory structure as claimed in claim 12, wherein the resistance-changing memory material includes a first memory material layer that can switch between a state of higher electrical resistance and a state of lower electrical resistance, and a second memory material layer whose electrical resistance is fixed.

20. A method for fabricating a non-volatile memory structure, comprising:
forming a first contact connected to a first transistor;
forming a second contact connected to a second transistor;
forming a resistance-changing memory material covering the first and second contacts;
removing the resistance-changing memory material covering the first contact; and
forming a top electrode covering the resistance-changing memory material, and also covering the first contact.

21. The method for fabricating a non-volatile memory structure as claimed in claim 20, further comprising performing an etching back process to remove a portion of the second contact, so that a top surface of the second contact is lower than that of the first contact after forming the second contact connected to the second transistor.

22. The method for fabricating a non-volatile memory structure as claimed in claim 20, wherein forming the top electrode comprises:
entirely forming a conductive material on the resistance-changing memory material; and
patterning the conductive material to form the top electrode, wherein the top electrode covers a top surface and sidewalls of the resistance-changing memory material.

23. A method for fabricating a non-volatile memory structure, comprising:
forming a dielectric layer covering a first transistor and a second transistor;
forming a first and second contact holes through the dielectric layer;
forming a first contact within the first contact hole to connect to a first transistor;
conformally forming a resistance-changing memory material covering a sidewall and a bottom of the second contact hole and the first contact, connecting to the second transistor;
removing the resistance-changing memory material covering the first contact; and
forming a top electrode covering the resistance-changing memory material and the first contact, filling the second contact hole.

24. The method for fabricating a non-volatile memory structure as claimed in claim 23, wherein forming the top electrode comprises:
entirely forming a conductive material on the resistance-changing memory material; and
patterning the conductive material to form the top electrode, wherein the top electrode covers a top surface and sidewalls of the resistance-changing memory material.

* * * * *